(12) United States Patent
Chen et al.

(10) Patent No.: US 10,971,386 B1
(45) Date of Patent: Apr. 6, 2021

(54) DEVICE POSITIONING USING SENSORS

(71) Applicant: TAIWAN SEMICONDUCTOR MANUFACTURING COMPANY LIMITED, Hsin-Chu (TW)

(72) Inventors: Yan-Han Chen, Miaoli County (TW); Cheng-Kang Hu, Kaohsiung (TW); Ren-Hau Wu, New Taipei (TW); Cheng-Hung Chen, Zhubei (TW); Feng-Kuang Wu, Hsinchu County (TW); Hsu-Shui Liu, Pingjhen (TW); Jiun-Rong Pai, Jhubei (TW); Shou-Wen Kuo, Hsinchu (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/572,960

(22) Filed: Sep. 17, 2019

(51) Int. Cl.
| | |
|---|---|
| *G06K 7/10* | (2006.01) |
| *H01L 21/67* | (2006.01) |
| *G06T 7/00* | (2017.01) |
| *H01L 21/677* | (2006.01) |
| *G06K 7/14* | (2006.01) |

(52) U.S. Cl.
CPC ...... *H01L 21/67265* (2013.01); *G06T 7/0004* (2013.01); *H01L 21/6773* (2013.01); *H01L 21/67775* (2013.01); *G06K 7/1417* (2013.01)

(58) Field of Classification Search
CPC ......... H01L 21/67265; H01L 21/67775; H01L 21/6773; H01L 2224/48227; H01L 2224/32225; H01L 2224/73265; G06T 7/0004; G06K 7/1417; G05B 2219/45031; G05B 19/128; E02F 9/205; E02F 9/265
See application file for complete search history.

(56) References Cited

U.S. PATENT DOCUMENTS

| | | | | |
|---|---|---|---|---|
| 5,525,808 A | * | 6/1996 | Irie ....................... | G03F 9/7003 |
| | | | | 250/548 |
| 5,863,680 A | * | 1/1999 | Kawakubo ................ | G03F 7/20 |
| | | | | 430/22 |
| 5,864,130 A | * | 1/1999 | Kahn .................. | G06K 7/10861 |
| | | | | 235/385 |
| 2006/0167571 A1 | * | 7/2006 | Wu ..................... | G05B 19/4183 |
| | | | | 700/83 |
| 2009/0146786 A1 | * | 6/2009 | Toma ................ | H01L 21/67294 |
| | | | | 340/10.1 |
| 2019/0378220 A1 | * | 12/2019 | Ibrahim ................. | G06Q 20/18 |

* cited by examiner

*Primary Examiner* — Thien M Le
(74) *Attorney, Agent, or Firm* — Cooper Legal Group, LLC

(57) ABSTRACT

A method for positioning a mobile device relative to a stationary device in a semiconductor manufacturing environment is disclosed. The method includes detecting a target affixed to the stationary device at a target location, wherein the target location corresponds to a location of the target relative to a reference point on the stationary device, determining a first position coordinate offset value based upon detecting the target, and moving the mobile device, using the first position coordinate offset value, relative to train the mobile device to move relative to the stationary device for the stationary device to performing a semiconductor manufacturing operation.

20 Claims, 9 Drawing Sheets

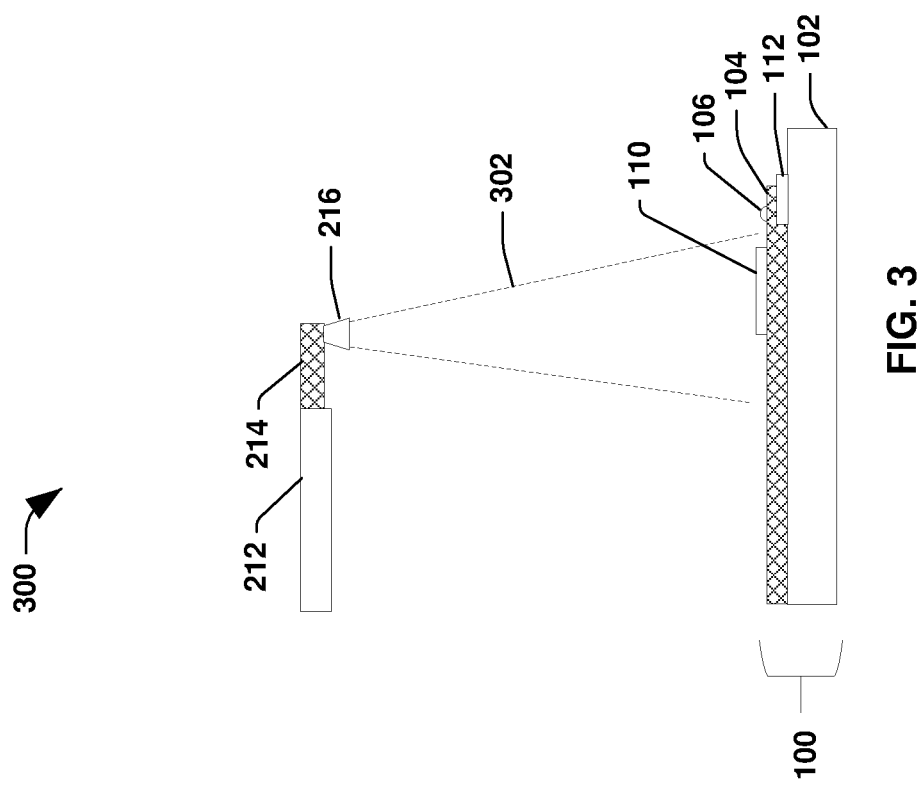

DEVICE POSITIONING USING SENSORS

BACKGROUND

During semiconductor fabrication, semiconductor wafers undergo different processes in a variety of machines or tools. The semiconductor wafers are often conveyed in different manners within a manufacturing environment in order to be subjected to the different processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a mobile device appendage with a sensor arm positioned in proximity to a stationary device, with a target in a field-of-view (FOV) of the sensor, according to some embodiments.

DETAILED DESCRIPTION

Figure 1:
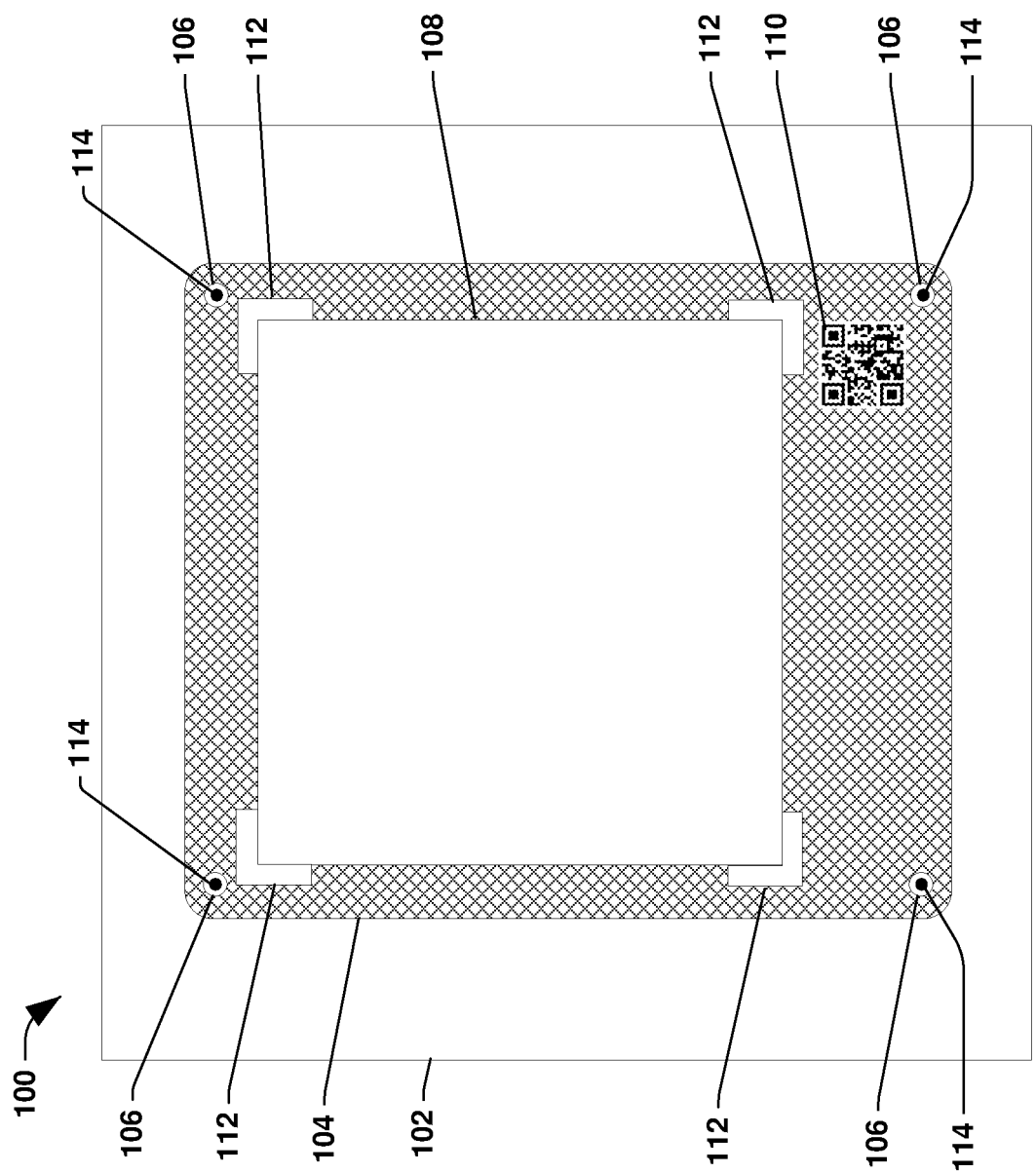
FIG. 1 illustrates a stationary device for holding a semiconductor wafer, according to some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments relate to a method for positioning a mobile device relative to a stationary device in a semiconductor manufacturing environment. In accordance with some embodiments, the method includes moving the mobile device, from a first mobile device position, relative to the stationary device until sensor data of a sensor affixed to the mobile device indicates that a target affixed to the stationary device is within a field of view of the sensor. The method also includes determining a first position coordinate offset value and a second position coordinate offset value of the target relative to a center position associated with the sensor data. The method also includes moving the mobile device to a second mobile device position relative to the stationary device based on the first position coordinate offset value and the second position coordinate offset value until the target is located relative to the center position. The method also includes saving the second mobile device position for subsequently moving the mobile device relative to the stationary device. The mobile device is thus at least one of automatically or programmatically moved to a position relative to the stationary device.

FIG. 1 illustrates a stationary device 100 for holding a semiconductor wafer container 108, according to some embodiments. In some embodiments, the semiconductor wafer container 108 is configured to contain one or more semiconductor wafers, such as for transport within a manufacturing environment. In some embodiments, the semiconductor wafer container 108 is a semiconductor pod. In some embodiments, a semiconductor pod includes a front opening unified pod (FOUP). In some embodiments, at least some of a semiconductor pod is regarded as or comprises a load port. In some embodiments, the semiconductor wafer container 108 is replaced by a semiconductor wafer, such that the semiconductor wafer is handled directly without being in a semiconductor wafer container 108. According to some embodiments, while the semiconductor wafer container 108 is illustrated as a quadrilateral from a top down view, the semiconductor wafer container 108 is any shape and not limited to a polygon.

According to some embodiments, the stationary device 100 includes a frame 102 with one or more alignment pins 114. In some embodiments, the stationary device 100 includes a base plate 104, where the base plate 104 defines one or more alignment holes 106. In some embodiments, the alignment pins 114 are positioned on the frame 102 to align with the alignment holes 106. In some embodiments, the alignment pins 114 are positioned to form a pattern and are fastened to the frame 102 using screws, nuts, bolts, springs, etc. to enable the alignment pins 114 to be locked in a particular pattern on the frame 102, such as a rectangular pattern, a triangular pattern, etc. The alignment holes 106 and alignment pins 114 are used together to align the base plate 104 in a particular orientation relative to the frame 102. In some embodiments, the alignment pins 114 are repositioned to accommodate different types of base plates 104 with different alignment holes 106 patterns. This permits the frame 102 to be reconfigured to accommodate different styles of base plates 104, with each base plate 104 having a unique pattern of alignment holes 106 that corresponds to the alignment pins 114 of the frame 102. In some embodiments, base plates 104 of the same function or configuration use the same pattern of alignment holes 106. In some embodiments, merely base plates 104 with the proper pattern of alignment holes 106 fit onto the frame 102 containing the alignment pins 114. In some embodiments, the base plate 104 is removable from the frame 102, such as to be replaced by a different base plate.

In some embodiments, the frame 102 is constructed of metal, ceramic, phenolic, nylon, plastic, or other suitable materials. In some embodiments, the frame 102 is part of a machine, device, chassis, etc., where the stationary device 100 is permanently affixed to a floor, wall, building structure, etc. and does not move. In some embodiments, the base plate 104 is constructed of metal, phenolic, plastic, nylon, or other suitable material. In some embodiments, the base plate 104 is electrically conductive or an insulator, such as depending upon a particular manufacturing process with which the stationary device 100 is associated.

In some embodiments, the stationary device 100 includes a target 110 and one or more alignment bosses 112, such as to stabilize the semiconductor wafer container 108 relative to the frame 102. In some embodiments, the target 110 is a QR code containing information related to the stationary device 100. In some embodiments, the target 110 is located at a target location that is an origin or dimensional center of the base plate 104. In some embodiments, the target 110 is located at a target location that is a distance away from the dimensional center of the base plate 104. In some embodiments, the target 110 includes at least one of first direction information or second direction information of the target location relative to a reference point on at least one of the base plate 104 or the frame 102. In some embodiments, the first direction information is x-axis direction information. In some embodiments, the second direction information is y-axis direction information. In some embodiments, the x-axis direction information and the y-axis direction information correlate to a first position coordinate offset value. In some embodiments, the reference point correlates to a second position coordinate offset value. In some embodiments, x-axis and y-axis coordinate offset values correlate to the location of the target 110 relative to the dimensional center of the base plate 104. In some embodiments, the target 110 includes information on an intended process to be performed on a semiconductor wafer. In some embodiments, the target 110 includes information on a load port type.

In some embodiments, the alignment bosses 112 are attached to the frame 102 and are constructed of metal, phenolic, plastic, nylon, or other suitable material. In some embodiments, the alignment bosses 112 are constructed to conform to one or more dimensions of the base plate 104. In some embodiments, the alignment bosses 112 hold the base plate 104, and thus the semiconductor wafer container 108, securely during manufacturing processes. In some embodiments, the base plate 104 secures the semiconductor wafer container 108 using mechanical tension applied by the alignment bosses 112. In some embodiments, the stationary device 100 includes a vacuum system (not shown) to hold the semiconductor wafer container 108 in position. In some embodiments, the base plate 104 includes a mechanical holding device (not shown), such as springs, straps, screws, bolts, clamps, etc. to hold the semiconductor wafer container 108 in place.

In some embodiments, the semiconductor wafer container 108 is constructed of metal, phenolic, plastic, nylon, or other suitable material. In some embodiments, the semiconductor wafer container 108 is square, rectangular, circular, or irregularly shaped. In some embodiments, the semiconductor wafer container 108 includes a plurality of wafers stacked vertically. In some embodiments, a semiconductor wafer within the semiconductor wafer container 108 is accessed by opening the semiconductor wafer container 108 and removing the semiconductor wafer to perform one or more semiconductor manufacturing operations on the wafer.

In some embodiments, the semiconductor wafer container 108 is attached to the base plate 104. The alignment pins 114 work in conjunction with the alignment holes 106 to align the base plate 104 to the frame 102. In some embodiments, a mobile device is moved in proximity near the stationary device 100 so that the target 110 is sensed by the mobile device. Data obtained by the mobile device from the target 110 provides information for aligning the mobile device relative to the stationary device. In some embodiments, the mobile device is automatically or programmatically aligned relative to the stationary device.

Figure 2:
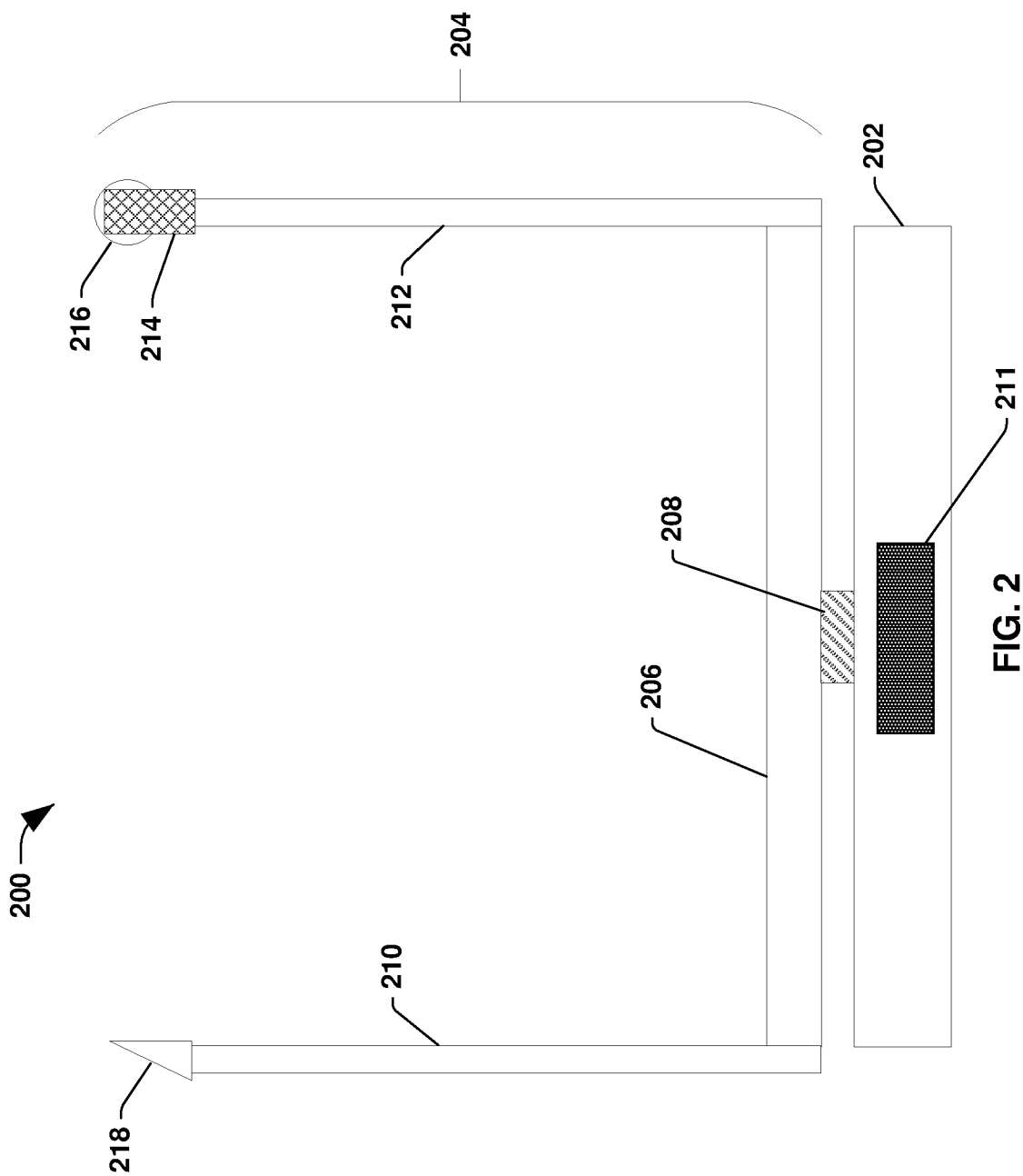
FIG. 2 illustrates a mobile device with a chassis, an appendage, a tool arm, and a sensor arm, according to some embodiments.

FIG. 2 illustrates a mobile device 200 including a chassis 202 attached to an appendage 204 including a base arm 206, a tool arm 210, and a sensor arm 212, according to some embodiments. In some embodiments, the chassis 202 moves vertically and horizontally to provide the appendage 204 a range of motion, as when the mobile device 200 is working with the stationary device 100. In some embodiments, the mobile device 200 moves via powered wheels, a track system, etc. to permit the mobile device 200 to move relative to the stationary device 100.

The chassis 202 is attached to the base arm 206 using a mount 208. The mount 208 includes a screw, bolt, pivot, hinge, ball and socket, etc. to mechanically link the appendage 204 to the chassis 202. In some embodiments, the appendage 204 moves independently relative to the chassis 202. In some embodiments, the tool arm 210 is configured to hold a tool head 218 to perform a process or processes on an object, such as the semiconductor wafer container 108 of FIG. 1. In some embodiments, the tool head 218 is interchangeable with other tool heads (not shown) to allow for a greater range of operation by the mobile device 200.

In some embodiments, the sensor arm 212 is mechanically connected to a sensor head 214 including a sensor 216. In some embodiments, the mobile device 200 comprises one or more robotic arms. In some embodiments, the sensor arm 212 is a first robotic arm. In some embodiments, the tool arm 210 is a second robotic arm. In some embodiments, the sensor 216 has a field-of-view (FOV) that allows the sensor 216 to detect and read the target 110 of FIG. 1. In some embodiments, the sensor 216 includes multiple cameras, detectors, etc. In some embodiments, the sensor 216 includes a camera that operates in IR, visible, UV, or other suitable light frequency ranges. In some embodiments, the sensor 216 is a laser or LED laser that emits laser light for detecting and reading the target 110 and sending the information from the sensor to a controller 211 or operator. In some embodiments, the controller 211 is embedded within the chassis 202 of the mobile device 200, as illustrated by FIG. 2. In some embodiments, the controller 211 is located within a device communicatively coupled to the mobile device 200, such as within a computer configured to control the mobile device 200. In some embodiments, the sensor head 214 is removable to allow the exchange and replacement of sensors 216 configured for a particular manufacturing process or target 110 type.

In some embodiments, the mobile device 200 moves from a first location where the target 110 is out of the FOV of the sensor 216 to a second location so that the target 110 is in the FOV of the sensor 216 to perform a manufacturing process to the semiconductor wafer container 108. In some embodiments, the mobile device 200 is pushed so that the sensor 216 is in the range of the target 110. The sensor 216 is activated to read the target 110. In some embodiments, the controller 211 determines the differences between a present target location and a desired target location. In some embodiments, the mobile device 200 senses the present location of the stationary device 100 and then determines the direction and extent of the differences between a present and a desired location of the mobile device 200. In some embodiments, the mobile device 200 is moved automatically to the desired location. The mobile device 200 is placed in position by remote control via the controller 211, according to some embodiments. In some embodiments, when a manufacturing process is complete, the mobile device 200 moves a distance away from the stationary device 100 to allow the retrieval of the semiconductor wafer container 108 and waits for the placement of another semiconductor wafer container 108 to repeat another manufacturing process. In some embodiments, different styles of mobile devices 200 move in proximity to the stationary device 100 to provide a string of manufacturing processes as needed.

FIG. 3 illustrates a scenario 300 with the appendage 204 positioned relative to the stationary device 100 with the target 110 positioned in the FOV 302 of the sensor 216, according to some embodiments. The target 110 is positioned at a known first location on the base plate 104 relative to a first reference point on the stationary device 100. The sensor 216 location is located at a known second location relative to a second reference point on the mobile device 200. The mobile device 200 (of FIG. 2) is moved into a position in the vicinity of the target 110 of the stationary device 100 so that the target 110 lies within the FOV 302 of the sensor 216. In some embodiments, the FOV 302 of the sensor 216 spans an angle that allows the sensor 216 to detect and read the target 110 within a known distance, such as a circle with a known radius, such as of 10 cm. In some embodiments, whenever the mobile device 200 is moved so that the sensor 216 is within a threshold, such as 20 cm, of the target 110, the sensor 216 reads the target 110, and the controller 211 associated with the mobile device 200 determines an offset value, such as a position coordinate offset value. In some embodiments, where the target 110 is too far away from the FOV 302 of the sensor 216, no results are determined and the mobile device 200 is moved a further distance before the target 110 is detected. In some embodiments, the FOV 302 varies with the distance between the target 110 and the sensor 216. In some embodiments, the FOV 302 covers a larger area of the stationary device 100 with an increase of distance between the target 110 and the sensor 216.

Figure 4:
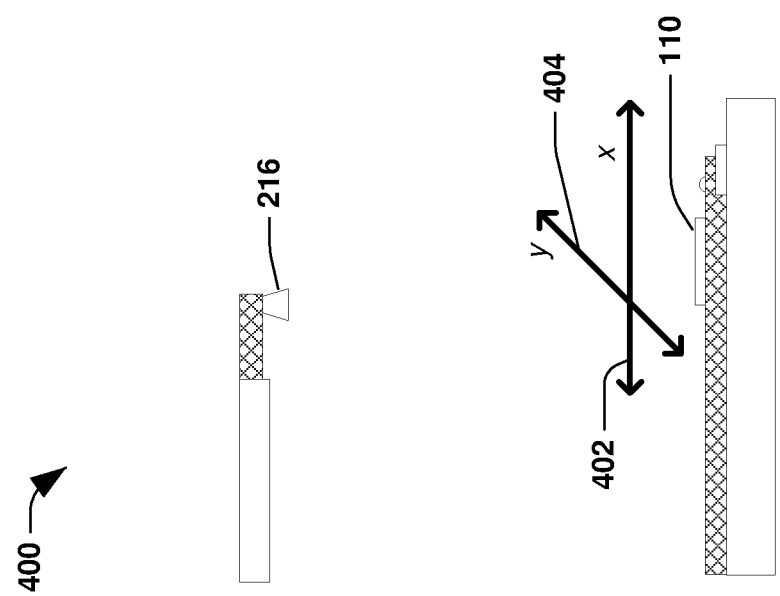
FIG. 4 illustrates a 2-dimensional (2D) coordinate system in a semiconductor manufacturing environment that includes a sensor and a target, according to some embodiments.

FIG. 4 illustrates a 2D coordinate system 400 in a manufacturing environment that includes the sensor 216 and the target 110, according to some embodiments. The 2D coordinate system further includes an x-axis 402 and a y-axis 404 for determining the offset values, such as one or more position coordinate offset values, between the target 110 in the FOV of the sensor 216. In some embodiments, the sensor 216 is fixably attached to the mobile device 200 of FIG. 2 and the target is fixably attached to the stationary device 100 of FIG. 1. In some embodiments, the sensor 216 is positioned directly over the target 110, thus providing for offset value of (0, 0) in x- and y-values between the present position and the desired position of the sensor 216. In some embodiments, at least one of the sensor 216 is located a distance away from the dimensional center of the mobile device 200 or the target is located a distance away from the dimensional center of the stationary device 100. Thus, in scenarios where the sensor 216 is directly over the target 110, there are non-zero offset values to center the mobile device 200 into a desired position relative to the stationary device 100.

Figure 5:
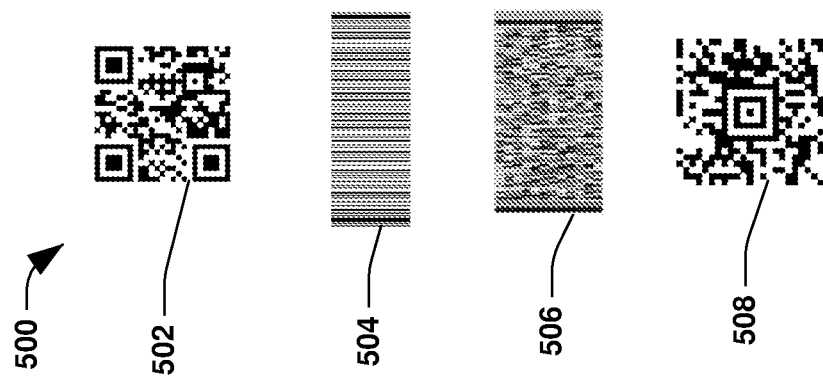
FIG. 5 illustrates several target types, according to some embodiments.

FIG. 5 illustrates several examples of target types 500, according to some embodiments. The target, such as target 110 of FIG. 1, is affixed to the stationary device 100. In some embodiments, the target 110 is a made of a reflective material that allows a sensor, such as sensor 216 of FIG. 2, to transmit and detect a light beam reflected back from the target. In some embodiments, the target is a QR code 502 that contains information about the base plate 104, such as center dimension information, process information, wafer information, etc. In some embodiments, the QR code 502 includes information about offset values, such as one or more position coordinate offset values, relating to the target 110 location and the desired location of the mobile device 200. In some embodiments, the target 110 is at least one of a first bar code 504, a second bar code 506, or a digital code 508. In some embodiments, the target 110 includes at least one of a reference point, information on the semiconductor wafer container 108 such as type of wafer, process to be performed, etc. Other embodiments are possible and are not limited by these examples, including, but not limited to, RF identification tags, radiometric targets, physical contact points, etc. In some embodiments, the stationary device 100 comprises a load port upon which a wafer carrier can be placed. The QR code 502 is decoded to identify a load port type of the load port.

Figure 6:
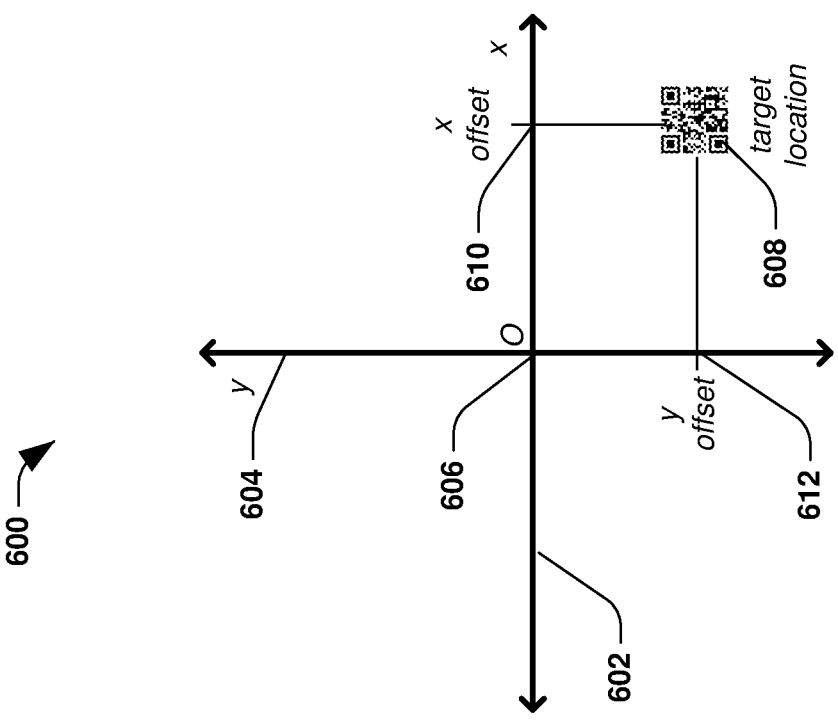
FIG. 6 illustrates a coordinate offset value system to position a mobile device relative to a stationary device using a target at a target location, according to some embodiments.

FIG. 6 illustrates a coordinate offset value system 600, such as a position coordinate offset value system, to position the mobile device 200 relative to the stationary device 100 using a QR code at a target location 608, according to some embodiments. The coordinate offset value system 600 includes an x-axis 602 and a y-axis 604 that intersect at an origin "0" 606. The coordinate offset value system 600 further includes the target location 608 that is located a distance away from the origin 606. The location of the target location uses an x-offset value 610 and a y-offset value 612 and is written as (x-offset, y-offset). In some embodiments, the target location 608 is located at the origin 606 with offset values of (0, 0).

In some embodiments, the sensor 216 does not need to be physically over the target 110. Offset values are obtained if the target 110 is within the FOV 302 of the sensor. In some embodiments, the mobile device 200 includes the controller 211 that determines the offset values required to move the mobile device 200 to the desired location over the stationary device 100. In some embodiments, the controller 211 determines an offset error that results from non-orthogonal lines of sight between the sensor 216 and the target 110, as when the sensor 216 is not directly over the target 110. In such cases, in addition to determining the offset values, the controller 211 determines additional error due to non-orthogonal lines-of-sight and mathematically adds this error term to the offset values to determine a final offset value for the mobile device 200 to use when the mobile device 200 is being repositioned.

Figure 7:
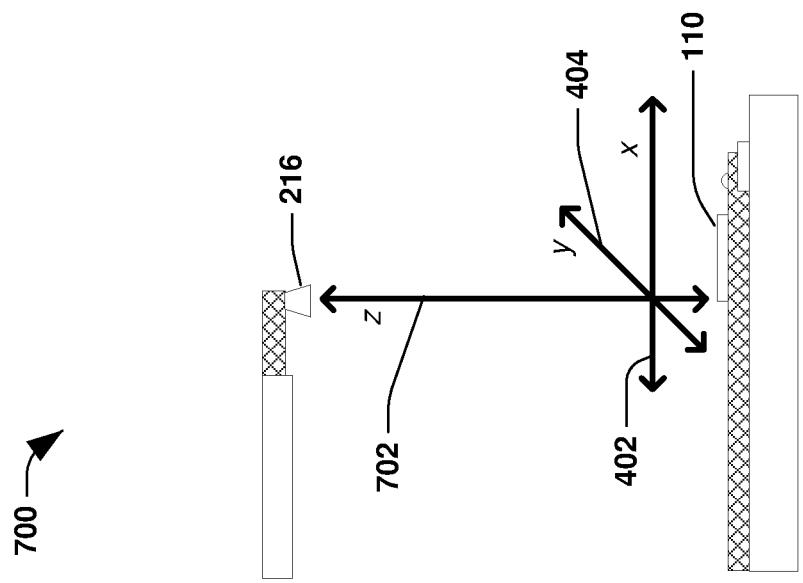
FIG. 7 illustrates a 3-dimensional (3D) coordinate offset value system to position a mobile device relative to a stationary device, according to some embodiments.

FIG. 7 illustrates a 3D coordinate offset value system 700, such as a position coordinate offset value system, to position the mobile device 200 to the stationary device 100, according to some embodiments. The 3D coordinate offset value system 700 is similar to the 2D coordinate system 400 of FIG. 4 but with the addition of a third direction. In some embodiments, the third direction is a z-axis 702. In some embodiments, sensors detect a target as long as the target is within the sensor's FOV, as with the sensor 216 and target 110 disclosed earlier. In some embodiments, the sensor 216 detects and measures the vertical distance between the sensor 216 and the target 110 to determine location information in 3D. In some embodiments, this allows the mobile device 200 to move to a desired location in 3D relative to the stationary device 100. In some embodiments, the z-axis 702 information is used to move the mobile device 200 a vertical distance relative to the stationary device 100, such as when the semiconductor wafer container 108 is being exchanged with another container.

Figure 8:
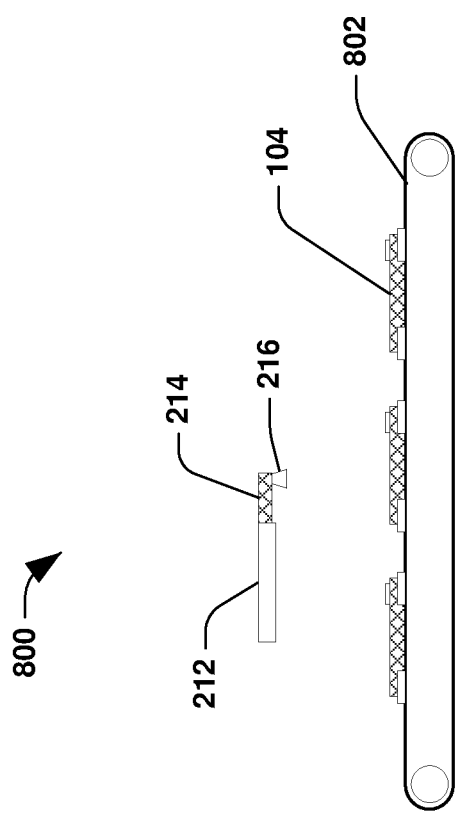
FIG. 8 illustrates a semiconductor manufacturing device with multiple base plates, each with a target, passing in the FOV of a sensor mounted on an appendage, according to some embodiments.

FIG. 8 illustrates a semiconductor manufacturing device 800 with multiple base plates 104, each having one target 110 and passing in the FOV of the sensor 216 mounted on the appendage 204, according to some embodiments. In some embodiments, the mobile device 200 holds multiple base plates 104 on a belt-type assembly line 802. The sensor 216 is mounted to the appendage 204 and is part of the stationary device 100. The assembly line 802 includes a point-to-point or, alternatively, a continuous loop movement device to transport base plates 104 towards and through the FOV of the sensor 216. The sensor 216 is part of the appendage 204 which is mechanically connected to the stationary device 100 and does not move. In some embodiments, the stationary device 100 includes multiple sensors 216, each with a FOV towards the assembly line 802.

In some embodiments, the assembly line 802 holds a plurality of base plates 104 in position by use of alignment bosses, alignment pins, vacuum force, friction force, etc. In some embodiments, the base plates 104 undergo processes by tools associated with the stationary device 100. As the plurality of base plates 104 move towards the FOV of the sensor 216, the sensor 216 detects the target 110 associated with each base plate 104 and sends the information obtained by the sensor 216 to the controller 211. In some embodiments, the controller 211 uses the information to at least one of begin, continue, end, or amend one or more semiconductor manufacturing processes on and a semiconductor wafer attached to a base plate 104.

Figure 9:
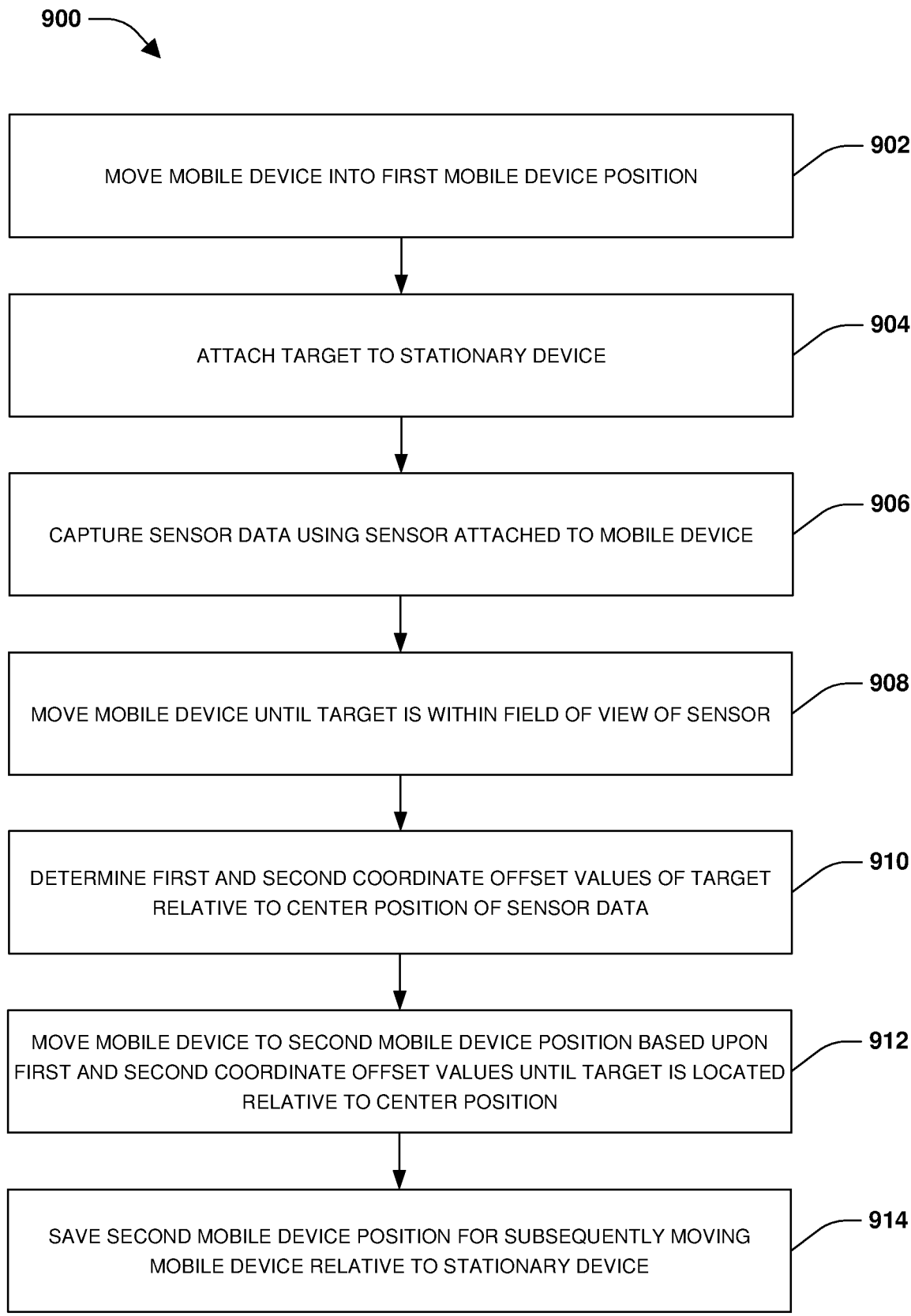
FIG. 9 illustrates an example flow diagram for positioning a mobile device to move relative to a stationary device, according to some embodiments.

FIG. 9 illustrates a method flow 900 for training the mobile device 200 to move from a first mobile device position to second mobile device position relative to the stationary device 100 in order to perform a semiconductor manufacturing operation. At 902, the mobile device 200 is moved into the first mobile device position. At 904, the target 110 is affixed to the stationary device 100. In some embodiments, the target 110 has already been affixed to the stationary device 100. At 906, sensor data is captured using a sensor 216 attached to the mobile device 200. In some embodiments, the mobile device 200 comprises a robotic arm, and the sensor 216 comprise a camera attached to the robotic arm, such as an end of the robotic arm. The camera is controlled to capture images/video of an environment and objects within a field of view of the camera. In some embodiments, the images are displayed through a graphical user interface on a display of a computing device, such as a computing device comprising the controller 211 configured to control movement of the mobile device 200.

At 908, the mobile device 200 is moved until the target 110 is within the field of view of sensor data captured by the sensor 216, such as when the target 110 is depicted in an image captured/generated by the camera. In some embodiments, an operator using the computing device to move the mobile device 200 stops moving the mobile device 200 based upon the operator determining that the target 110 is depicted in the image. In some embodiments, the operator issues a command to the controller 211 to further train the mobile device 200. At 910, a first position coordinate offset value and a second position coordinate offset value of the target 110 relative to a center position associated with the sensor data is determined. In some embodiments, the controller 211 determines the first position coordinate offset value and the second position coordinate offset value relative to a center position of the image within which the target 110 is depicted.

At 912, the mobile device 200 is moved into a second mobile device position based upon the first position coordinate offset value and the second position coordinate offset value until the target 110 is located relative to the center position. In some embodiments, the controller 211 moves the mobile device 200 until the target 110 would be at the center position of the image. At 914, the second mobile device position is saved for subsequently moving the mobile device 200 relative to the stationary device 100.

Figure 10:
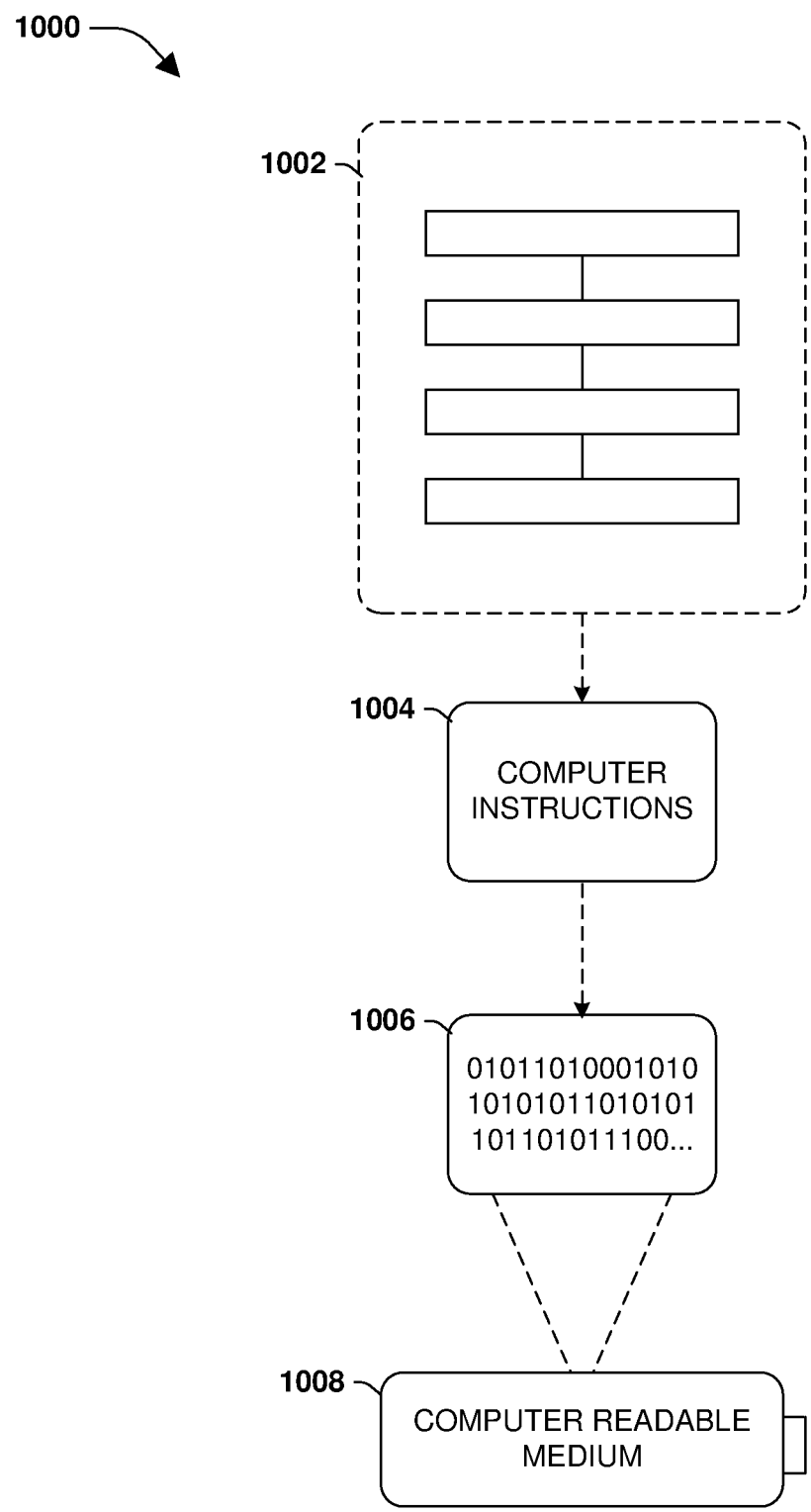
FIG. 10 illustrates an example computer-readable medium wherein processor-executable instructions configured to embody one or more of the provisions set forth herein may be comprised, according to some embodiments.

Still another embodiment involves a computer-readable medium comprising processor-executable instructions configured to implement one or more of the techniques presented herein. An exemplary computer-readable medium is illustrated in FIG. 10, wherein the embodiment 1000 comprises a computer-readable medium 1008 (e.g., a CD-R, DVD-R, flash drive, a platter of a hard disk drive, etc.), on which is encoded computer-readable data 1006. This computer-readable data 1006 in turn comprises a set of processor-executable computer instructions 1004 configured to operate according to one or more of the principles set forth herein. In some embodiments 1000, the processor-executable computer instructions 1004 are configured to perform a method 1002, such as at least some of the aforementioned described methods. In some embodiments, the processor-executable computer instructions 1004 are configured to implement a system, such as at least some of the aforementioned systems. Many such computer-readable media may be devised by those of ordinary skill in the art that are configured to operate in accordance with the techniques presented herein.

Figure 11:
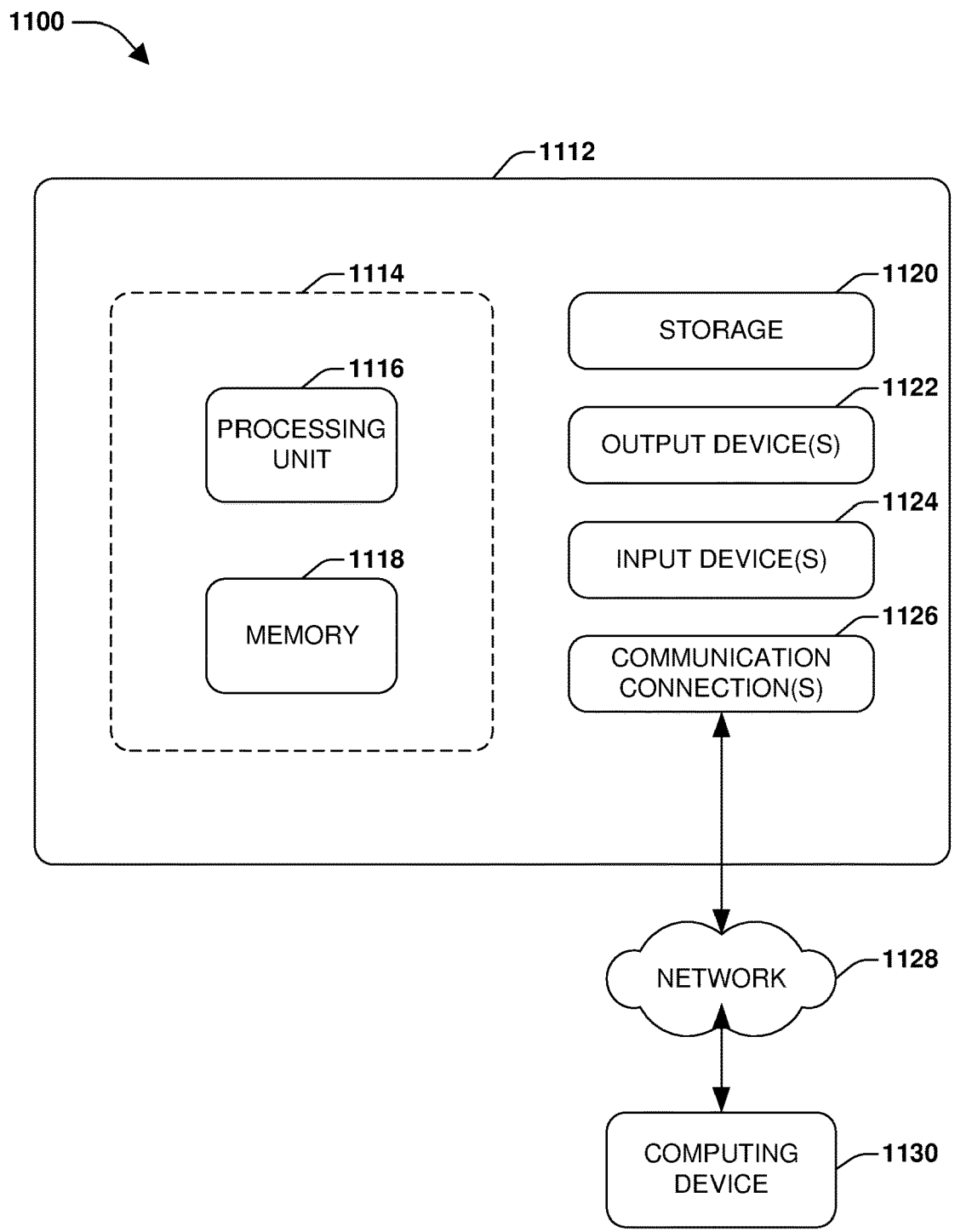
FIG. 11 illustrates an example computing environment wherein one or more of the provisions set forth herein may be implemented, according to some embodiments.

FIG. 11 and the following discussion provide a brief, general description of a suitable computing environment to implement embodiments of one or more of the provisions set forth herein. The operating environment of FIG. 11 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 depicts an example of a system 1100 comprising a computing device 1112 configured to implement some embodiments provided herein. In some embodiments, at least some of the system 1100 corresponds to a controller, such as controller 211. In some configurations, computing device 1112 includes at least one processing unit 1116 and memory 1118. Depending on the exact configuration and type of computing device, memory 1118 may be volatile (such as RAM, for example), non-volatile (such as ROM, flash memory, etc., for example) or some combination of the two. This configuration is illustrated in FIG. 11 by dashed line 1114.

In some embodiments, computing device 1112 may include additional features and/or functionality. For example, computing device 1112 may also include additional storage (e.g., removable and/or non-removable) including, but not limited to, magnetic storage, optical storage, and the like. Such additional storage is illustrated in FIG. 11 by storage 1120. In some embodiments, computer readable instructions to implement one or more embodiments provided herein may be in storage 1120. Storage 1120 may also store other computer readable instructions to implement an operating system, an application program, and the like. Computer readable instructions may be loaded in memory 1118 for execution by processing unit 1116, for example.

The term "computer readable media" as used herein includes computer storage media. Computer storage media includes volatile and nonvolatile, removable and non-removable media implemented in any method or technology for storage of information such as computer readable instructions or other data. Memory 1118 and storage 1120 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1112. Any such computer storage media may be part of computing device 1112.

Computing device 1112 may also include communication connection(s) 1126 that allows computing device 1112 to communicate with other devices. Communication connection(s) 1126 may include, but is not limited to, a modem, a Network Interface Card (NIC), an integrated network interface, a radio frequency transmitter/receiver, an infrared port, a USB connection, or other interfaces for connecting computing device 1112 to other computing devices. Communication connection(s) 1126 may include a wired connection or a wireless connection. Communication connection(s) 1126 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1112 may include input device(s) 1124 such as keyboard, mouse, pen, voice input device, touch input device, infrared cameras, video input devices, and/or any other input device. Output device(s) 1122 such as one or more displays, speakers, printers, and/or any other output device may also be included in computing device 1112. Input device(s) 1124 and output device(s) 1122 may be connected to computing device 1112 via a wired connection, wireless connection, or any combination thereof. In some embodiments, an input device or an output device from another computing device may be used as input device(s) 1124 or output device(s) 1122 for computing device 1112.

Components of computing device 1112 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1112 may be interconnected by a network. For example, memory 1118 may be comprised of multiple physical memory units located in different physical locations interconnected by a network.

Those skilled in the art will realize that storage devices utilized to store computer readable instructions may be distributed across a network. For example, a computing device 1130 accessible via a network 1128 may store computer readable instructions to implement one or more embodiments provided herein. Computing device 1112 may access computing device 1130 and download a part or all of the computer readable instructions for execution. Alternatively, computing device 1112 may download pieces of the computer readable instructions, as needed, or some instructions may be executed at computing device 1112 and some at computing device 1130.

According to some embodiments, a method for positioning a mobile device relative to a stationary device in a semiconductor manufacturing environment is provided. The method includes moving the mobile device, from a first mobile device position, relative to the stationary device until sensor data of a sensor affixed to the mobile device indicates that a target affixed to the stationary device is within a field of view of the sensor, determining a first position coordinate offset value and a second position coordinate offset value of the target relative to a center position associated with the sensor data, moving the mobile device to a second mobile device position relative to the stationary device based on the first position coordinate offset value and the second position coordinate offset value until the target is located relative to the center position, and saving the second mobile device position for subsequently moving the mobile device relative to the stationary device.

According to some embodiments, a method for positioning a mobile device relative to a stationary device in a semiconductor manufacturing environment is provided. The method includes detecting a target affixed to the stationary device at a target location, wherein the target location corresponds to a location of the target relative to a reference point on the stationary device, determining a first position coordinate offset value based upon detecting the target, and moving the mobile device, using the first position coordinate offset value, relative to the stationary device to train the mobile device to move relative to the stationary device for performing a semiconductor manufacturing operation.

According to some embodiments, a system for positioning a mobile device relative to a stationary device in a semiconductor manufacturing environment is provided. The system includes a sensor affixed to the mobile device, wherein the sensor generates sensor data indicative of a target sensed by the sensor where the target is affixed to the stationary device at a target location and is in a field of view of the sensor when the mobile device is at a first mobile device position, and a controller configured to calculate a first position coordinate offset value and a second position coordinate offset value based on the sensor data, move the mobile device from the first mobile device position to a second mobile device position based upon the first position coordinate offset value and the second position coordinate offset value, and save the second mobile device position to train the mobile device to move relative to the stationary device.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for positioning a mobile device relative to a stationary device in a semiconductor manufacturing environment, comprising:
    moving the mobile device, from a first mobile device position, relative to the stationary device until an image acquired from a sensor affixed to the mobile device indicates that a target affixed to the stationary device is within a field of view of the sensor;
    determining a first position coordinate offset value and a second position coordinate offset value of the target relative to a center position within the image based upon a location of the target in the image relative to the center position within the image;
    moving the mobile device to a second mobile device position relative to the stationary device based upon the first position coordinate offset value and the second position coordinate offset value until the target is located within the image at a specified position relative to the center position; and
    saving the second mobile device position for subsequently moving the mobile device relative to the stationary device.

2. The method of claim 1, wherein the target comprises at least one of a barcode or a quick response (QR) code.

3. The method of claim 1, wherein the sensor comprises at least one of an infrared-sensing camera, a visible-light sensing camera, or an ultraviolet-sensing camera.

4. The method of claim 1, wherein the target is affixed to the stationary device at a target location corresponding to a location of the target relative to a reference point on the stationary device.

5. The method of claim 1, wherein the mobile device comprises a robotic arm, and moving the mobile device comprises using the robotic arm to place a semiconductor wafer on the stationary device.

6. The method of claim 1, wherein the mobile device comprises a robotic arm, and moving the mobile device comprises using the robotic arm to at least one of place a semiconductor pod on the stationary device or remove the semiconductor pod from the stationary device.

7. The method of claim 6, wherein the robotic arm comprises an appendage for lifting the semiconductor pod and the sensor is affixed to the appendage.

8. The method of claim 1, comprising decoding the target to determine a load port type of the stationary device.

9. A method for positioning a mobile device relative to a stationary device in a semiconductor manufacturing environment, comprising:
   detecting, in an image, a target affixed to the stationary device at a target location, wherein the target location corresponds to a location of the target relative to a reference point on the stationary device;
   determining a first position coordinate offset value based upon a location of the target in the image relative to a specified position within the image; and
   moving the mobile device, using the first position coordinate offset value, relative to the stationary device to train the mobile device to move relative to the stationary device for performing a semiconductor manufacturing operation.

10. The method of claim 9, wherein moving the mobile device comprises placing a semiconductor wafer on the stationary device.

11. The method of claim 9, wherein moving the mobile device comprises at least one of placing a semiconductor pod on the stationary device or removing the semiconductor pod from the stationary device.

12. The method of claim 9, wherein detecting the target comprises detecting the target with a sensor affixed to the mobile device at a first sensor location, wherein the first sensor location corresponds to a location of the sensor relative to a reference point on the mobile device, and wherein the sensor is configured to generate the image.

13. The method of claim 12, wherein the sensor comprises at least one of an infrared-sensing camera, a visible-light sensing camera, or an ultraviolet-sensing camera.

14. The method of claim 9, wherein the target comprises at least one of a bar code or a quick response (QR) code.

15. A system for positioning a mobile device relative to a stationary device in a semiconductor manufacturing environment, comprising:
   a sensor affixed to the mobile device, wherein the sensor generates an image comprising a target sensed by the sensor when the target is in a field of view of the sensor, wherein the target is affixed to the stationary device at a target location; and
   a controller configured to:
      calculate a first position coordinate offset value and a second position coordinate offset value based upon a location of the target in the image relative to a specified position within the image;
      move the mobile device from a first mobile device position to a second mobile device position based upon the first position coordinate offset value and the second position coordinate offset value; and
      save the second mobile device position to train the mobile device to move relative to the stationary device.

16. The system of claim 15, wherein the controller is configured to decode the target to determine a load port type of the stationary device.

17. The system of claim 15, wherein the target comprises at least one of a barcode or a QR code.

18. The system of claim 15, wherein the target location corresponds to a location of the target relative to a reference point on the stationary device.

19. The system of claim 15, wherein the sensor comprises at least one of an infrared-sensing camera, a visible-light sensing camera, or an ultraviolet-sensing camera.

20. The system of claim 15, wherein the controller is configured to control movement of the mobile device to at least one of place a semiconductor pod on the stationary device or remove the semiconductor pod from the stationary device.

* * * * *